(12) United States Patent
Rigole et al.

(10) Patent No.: US 7,957,618 B2
(45) Date of Patent: Jun. 7, 2011

(54) INTEGRATED PHOTONIC CIRCUIT

(75) Inventors: Pierre-jean Rigole, Bromma (SE); Jan-olof Wesstrom, Stockholm (SE)

(73) Assignee: Syntune AB, Kista (SE)

( * ) Notice: Subject to any disclaimer, the term of this patent is extended or adjusted under 35 U.S.C. 154(b) by 699 days.

(21) Appl. No.: 11/909,776

(22) PCT Filed: Mar. 17, 2005

(86) PCT No.: PCT/SE2006/000342
§ 371 (c)(1),
(2), (4) Date: Sep. 26, 2007

(87) PCT Pub. No.: WO2006/104441
PCT Pub. Date: Oct. 5, 2006

(65) Prior Publication Data
US 2010/0183043 A1    Jul. 22, 2010

(30) Foreign Application Priority Data
Mar. 31, 2005 (SE) ...................... 0500703

(51) Int. Cl.
*G02B 6/42* (2006.01)
(52) U.S. Cl. ................ 385/47; 385/14; 385/31; 385/37; 372/50.11

(58) Field of Classification Search ............... 385/14, 385/47
See application file for complete search history.

(56) References Cited

U.S. PATENT DOCUMENTS

| | | | |
|---|---|---|---|
| 5,825,952 A * | 10/1998 | Kawanishi et al. | 385/47 |
| 6,243,516 B1 * | 6/2001 | Seino | 385/47 |
| 6,421,482 B1 | 7/2002 | Augustsson | |
| 7,310,363 B1 * | 12/2007 | Mason et al. | 372/50.1 |
| 2004/0101229 A1 | 5/2004 | Takagi | |
| 2004/0247245 A1 * | 12/2004 | Kim et al. | 385/47 |
| 2005/0025419 A1 | 2/2005 | Bish | |

* cited by examiner

*Primary Examiner* — Minsun Harvey
*Assistant Examiner* — Xnning Niu
(74) *Attorney, Agent, or Firm* — Young & Thompson

(57) ABSTRACT

An integrated photonic circuit includes waveguides (12-19) and other photonic components. The photonic circuit has a first part (1) and a second part (2), the first part and the second part being connected to a mirror in the form of a half 2×2 multimode interferometer (MMI) (32), which comprises solely one half MMI (31) in a longitudinal direction, the half MMI (32) having two ports (33, 34) and being arranged to reflect half of the light that is incident on one of the ports to one port and transmit half of the incident light to the second port, and the free surface (35) of the half MMI (32) having been treated with a highly reflective material.

7 Claims, 1 Drawing Sheet

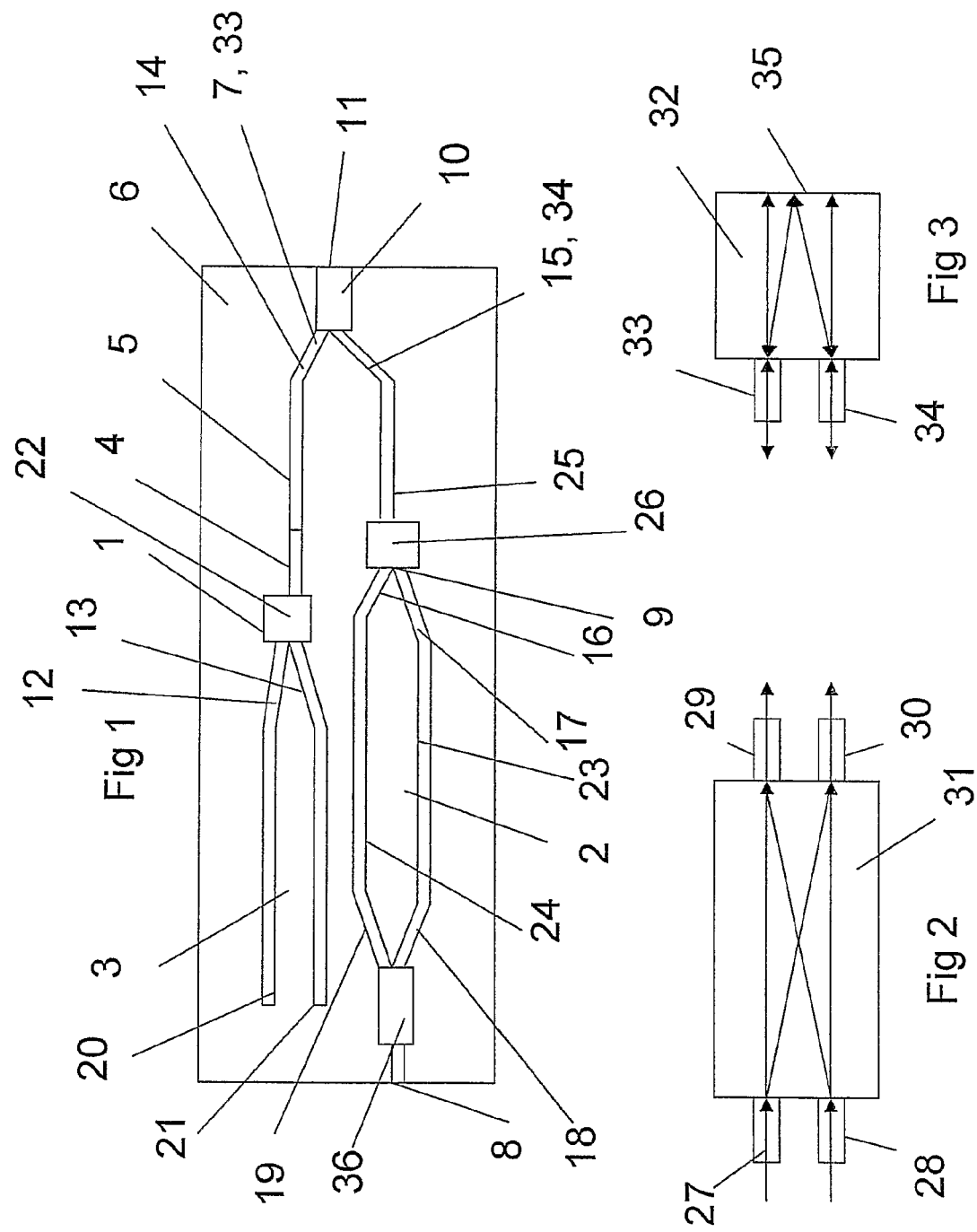

INTEGRATED PHOTONIC CIRCUIT

The present invention relates to an integrated photonic circuit.

Integrated photonic circuits often comprise a waveguide, which may have branches. It is desirable in certain photonic circuits to form a cavity, a laser cavity for example, between two reflectors on the waveguide. It is often appropriate for these reflectors to have a high reflectivity and a broad spectral bandwidth. This can be achieved by, for example, a short grating that has a high contrast index or a discontinuity such as an air gap.

Such photonic circuits suffer from two problems. One problem is that such a chip will become very long if many elements are integrated into the chip. The length in itself is a problem when it is a matter of using components on a circuit board or equivalent, or when the chip is to be placed inside a small capsule, for example in data communication or telecommunication, where the chip constitutes a communication laser. A second problem is that it is difficult to obtain a high reflectivity across a broad bandwidth.

The present invention solves these problems.

The present invention thus relates to an integrated photonic circuit comprising waveguides and other photonic components, and it is characterised in that the photonic circuit has a first part and a second part, in that the first part and the second part are connected to a mirror in the form of a half 2×2 multimode interferometer (MMI), which comprises solely one half in a longitudinal direction, in that the said half MMI has two ports and is arranged to reflect half of the light that is incident on one of the ports to one port and transmit half of the incident light to the second port, and in that the free surface of the said half MMI (32) has been treated with a highly reflective material.

The invention is described in more detail below, partially in association with an embodiment of the invention shown in the attached drawing, where FIG. 1 shows a photonic circuit according to the invention with an integrated laser, FIG. 2 shows a known 2×2 multimode interferometer, and FIG. 3 shows a multimode interferometer according to the invention and which is exploited in the photonic circuit according to FIG. 2.

FIG. 1 shows an integrated photonic circuit comprising waveguides and other photonic components. The symbols 12-19 in FIG. 1 refer to waveguides.

The photonic circuit has, according to the invention, a first part 1 and a second part 2.

The first part and the second part are connected to a mirror in the form of a half multimode interferometer (MMI) 32, that comprises solely a half MMI along its longitudinal direction. The said half MMI has two ports 33, 34, shown in FIG. 3, and it is arranged to reflect 50% of the light that is incident on one of the ports to one port 33 and to transmit 50% of the light that is incident to the second port 34. Furthermore, the free surface 35 of the said half MMI has been treated with a highly reflective material.

FIG. 1 shows an integrated photonic circuit comprising a laser 1 and a Mach-Zender interferometer 2.

According to one preferred embodiment of the invention, the laser 1 comprises at least one reflector 3, and phase section 4 and an amplifier section 5. The sections 3-5 are arranged consecutive to each other on a support material 6, with the first, light-emitting, end 7 of the laser pointing in a first direction.

The Mach-Zender interferometer 2 is arranged on the said support material 6 next to the laser with the first, light-emitting, end 8 of the interferometer 2 pointing in a second direction, where the second direction is opposite to the said first direction.

FIG. 2 shows a complete 2×2 multimode interferometer (MMI) 31. This divides incident light such that half of the light that is incident onto one of the two inputs 27, 28 is transmitted to each of the outputs 29, 30.

According to one preferred embodiment, the said laser 1 is a tuneable laser.

It is further preferred that the said laser 1 comprises two Bragg reflectors 20, 21 that are connected through what is known as a "splitter" 22 to a phase section 4, which is connected to an amplifier section 5.

The said Mach-Zender interferometer 2 is arranged to divide incident light into two waveguides 23, 24, and is arranged to guide the phase angle of the light in one or in both of the waveguides such that the light in the two waveguides 23, 24 is added to the output 8 of the Mach-Zender interferometer or such that the light in the two waveguides cancel each other. This is controlled in a known manner through a voltage being applied across the waveguides 23, 24. The emission by the chip of a varying light is achieved by controlling the voltage applied as specified by the information that is to be transmitted by means of the communication laser.

An amplifier 25 in the form of what is known as a "semiconductor optical amplifier" (SOA) is located between the said MMI 10 and the Mach-Zender interferometer 2. A splitter 26 is located between the amplifier 25 and the Mach-Zender interferometer 2. A 2×2 multimode interferometer 36 is located after the Mach-Zender interferometer.

FIG. 3 shows the said half multimode interferometer 32. This has two ports 33, 34. A component is formed through this arrangement that reflects half of the incident light to one of the ports 33 and that transmits half of the incident light to the second port 34. The free surface 35 of the said half MMI 32 has been treated with a highly reflective material. This is achieved by, for example, the surface 35 being coated with a metal or with a number of layers with a high contrast index. The said half MMI will thus function as a highly efficient mirror.

The chip can be made approximately half as long through the use of the half MMI 32, in that the circuit before and after the half MMI 32 principally leads light in different directions.

The present invention thus solves the problems described in the introduction above.

A number of embodiments have been described above. It is however clear that the said half MMI can be used for circuits other than those described above in order to reflect light such that the light is led in opposite directions.

Thus the present invention is not to be considered as limited to the embodiments specified above, since it can be varied within the scope of the attached patent claims.

The invention claimed is:

1. An integrated photonic circuit comprising waveguides (12-19) and other photonic components, wherein,
the photonic circuit has a first part (1) and a second part (2),
the first part and the second part are connected to a mirror in the form of a half 2×2 multimode interferometer (MMI) (32), which comprises solely one half MMI (31) in a longitudinal direction,
said half MMI (32) has two ports (33, 34) and is arranged to reflect half of the light that is incident on one of the ports to one port and transmit half of the incident light to the second port, and
the free surface (35) of said half MMI (32) has been treated with a highly reflective material, the first part is a laser (1) and the second part is a Mach-Zender interferometer (2), wherein the laser comprises at least one reflector (3), a phase section (4) and an amplifier section (5), which sections are arranged subsequent to each other on a support (6) with the first, light-emitting, end of the laser (1) pointing in a first direction, and said Mach-Zender interferometer (2) is arranged on said support material (6) next to said laser (1) with the first, light-emitting, end of the interferometer (2) pointing in a second direction, wherein said second direction is opposite to said first direction, and said half MMI (32) is located between the first, light-emitting, end of the laser (1) and the second, light-receiving, end of the interferometer (2), said laser (1) is a tuneable laser, and said laser (1) comprises two Bragg reflectors (20, 21) on the same side of the laser and connected through a splitter (22) to the phase section (4), which is connected to the amplifier section (5).

2. The integrated photonic circuit according to claim 1, wherein said Mach-Zender interferometer (2) is arranged to divide incident light into two waveguides (23, 24) and arranged to adjust the phase angle of the light in one waveguide (23, 24) such that the light in the two waveguides is added to the output of the Mach-Zender interferometer (2) or such that the light in the two waveguides cancel each other.

3. The integrated photonic circuit according to claim 1, wherein an amplifier in the form of a semiconductor optical amplifier (SOA) (25) is located between said half MMI (32) and the Mach-Zender interferometer (2).

4. The integrated photonic circuit according to claim 1, wherein an MMI (36) is located after said Mach-Zender interferometer (2), the output of which has been treated with an anti-reflective material.

5. The integrated photonic circuit according to claim 2, wherein an amplifier in the form of a semiconductor optical amplifier (SOA) (25) and is located between said half MMI (32) and the Mach-Zender interferometer (2).

6. The integrated photonic circuit according to claim 2, wherein an MMI (36) is located after said Mach-Zender interferometer (2), the output of which has been treated with an anti-reflective material.

7. The integrated photonic circuit according to claim 3, wherein an MMI (36) is located after said Mach-Zender interferometer (2), the output of which has been treated with an anti-reflective material.

* * * * *

UNITED STATES PATENT AND TRADEMARK OFFICE
CERTIFICATE OF CORRECTION

Page 1 of 1

PATENT NO.      : 7,957,618 B2
APPLICATION NO. : 11/909776
DATED           : June 7, 2011
INVENTOR(S)     : Rigole et al.

It is certified that error appears in the above-identified patent and that said Letters Patent is hereby corrected as shown below:

On the title page, please amend Item (22) to read as follows:

-- (22) PCT Filed: Mar. 17, 2006 --

Signed and Sealed this
Thirteenth Day of September, 2011

David J. Kappos
*Director of the United States Patent and Trademark Office*